(12) United States Patent
Takahashi (10) Patent No.: US 8,984,037 B2
(45) Date of Patent: Mar. 17, 2015

(54) POWER SUPPLY CONTROL APPARATUS

(71) Applicant: Renesas Electronics Corporation, Kawasaki-shi, Kanagawa (JP)

(72) Inventor: Hideyuki Takahashi, Yokohama (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 291 days.

(21) Appl. No.: 13/682,183

(22) Filed: Nov. 20, 2012

(65) Prior Publication Data

US 2013/0132451 A1  May 23, 2013

(30) Foreign Application Priority Data

Nov. 21, 2011 (JP) ................................. 2011-253983

(51) Int. Cl.
*G06F 17/10* (2006.01)
*H02M 3/157* (2006.01)
*H02M 1/00* (2006.01)

(52) U.S. Cl.
CPC ............... *G06F 17/10* (2013.01); *H02M 3/157* (2013.01); *H02M 2001/0012* (2013.01)
USPC .......................................................... 708/300

(58) Field of Classification Search
None
See application file for complete search history.

(56) References Cited

U.S. PATENT DOCUMENTS

| | | | | |
|---|---|---|---|---|
| 7,783,269 B2* | 8/2010 | Vinayak et al. | ................. | 455/126 |
| 8,050,638 B2* | 11/2011 | Vinayak et al. | ................. | 455/126 |
| 8,099,199 B2* | 1/2012 | Takegami et al. | ............. | 700/298 |
| 2009/0081968 A1* | 3/2009 | Vinayak et al. | ................. | 455/110 |
| 2010/0311365 A1* | 12/2010 | Vinayak et al. | ............. | 455/127.1 |
| 2013/0132451 A1* | 5/2013 | Takahashi | ..................... | 708/200 |

FOREIGN PATENT DOCUMENTS

JP      2006-050723 A     2/2006

* cited by examiner

*Primary Examiner* — David H Malzahn
(74) *Attorney, Agent, or Firm* — McGinn IP Law Group, PLLC

(57) ABSTRACT

A power supply control apparatus includes a first adder configured to generate a difference signal based on a target value and a feedback signal; a compensator having a first transfer function Wc(z) and configured to generate a control signal based on the difference signal; a control target having a second transfer function Wp(z) and configured to output an output signal generated in response to the control signal; a disturbance canceller having a third transfer function {1+Wc(z)·Wp(z)}/{Wc(z)·Wp(z)} and configured to generate a disturbance cancelling signal based on the output signal corresponding to a control amount y; a second adder configured to generate a differential disturbance signal based on an output of the first adder and the disturbance cancelling signal; and a filter circuit which generates the feedback signal based on the differential disturbance signal.

5 Claims, 11 Drawing Sheets

POWER SUPPLY CONTROL APPARATUS

CROSS REFERENCE

The present application claims a priority on convention based on Japanese Patent Application No. JP 2011-253983. The disclosure thereof is incorporated herein by reference.

TECHNICAL FIELD

The present invention relates to a power supply control apparatus, and more particularly relates to a technique for miniaturizing a switching power supply control apparatus of a digital control type.

BACKGROUND ART

In recent years, in consumer appliances such as a digital home electric appliance, mobile equipment and the like, it is requested to improve a response speed of a switching power supply apparatus and improve performances through a drop in noise so as to supply power in linkage with an operation sequence based on a communication situation. A technique of performance improvement of the switching power supply control apparatus is known (for example, refer to Patent Literature 1).

Figure 1:
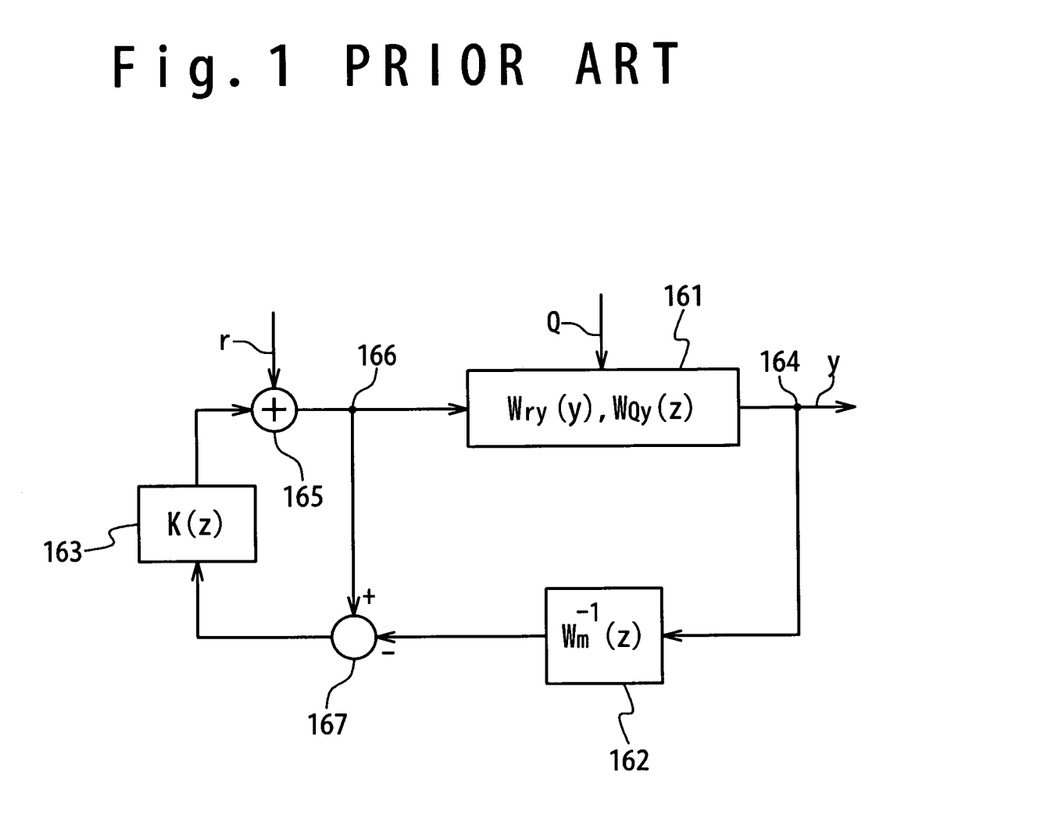
FIG. 1 is a block diagram showing a configuration of a power supply control apparatus described in Patent Literature 1.

FIG. 1 is a block diagram showing the configuration of the power supply control apparatus described in the Patent Literature 1. The power supply control apparatus contains a transfer element 161 of a system that includes transfer functions $W_{ry}(Z)$ and $W_{Qy}(z)$ in which an equivalent disturbance Q is considered; a transfer element 162 of an inverse system $W_m^{-1}(z)$; and a transfer element 163 as a robust compensator that includes a filter K(z).

A control amount y as an output of the transfer element 161 is drawn out at a node 164 and applied to the transfer element 162. An output from an adder 165 for adding an output of the transfer element 163 and a target value r is added to a different adder 167 via a node 166 and also supplied to the transfer element 161. Also, the adder 167 supplies a difference (subtraction value) between the output of the adder 165, which is branched at the node 166, and the output of the transfer element 162 to the transfer element 163.

Figure 2:
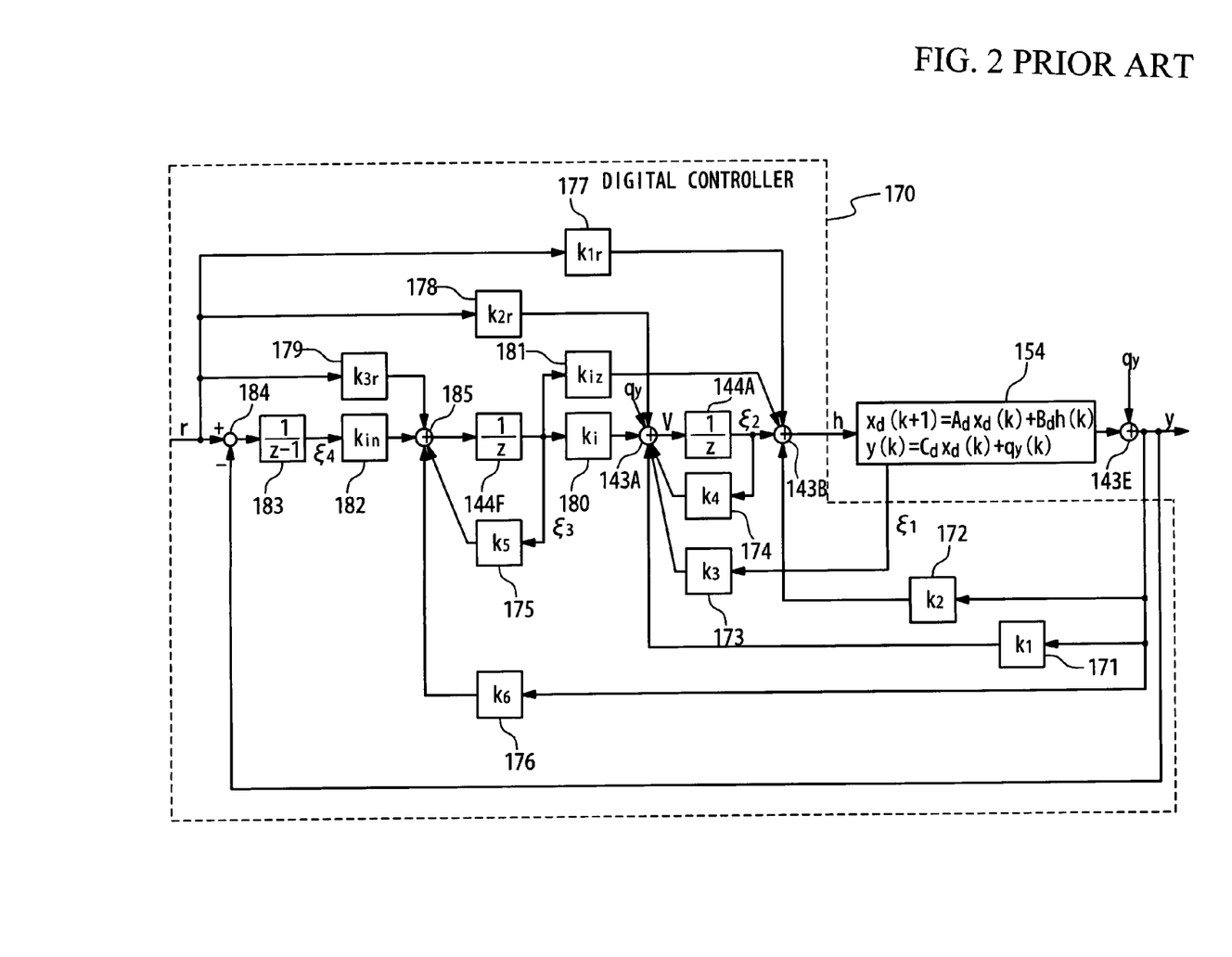
FIG. 2 is a block diagram when the power supply control apparatus described in Patent Literature 1 is equivalently converted.

FIG. 2 is a block diagram in which the power supply control apparatus shown in FIG. 1 is equivalently converted. With reference to FIG. 2, the power supply control apparatus includes a control target element 154, which satisfies the following state equations when an input h, the control amount y, a first equivalent disturbance $q_y$, and a delay $\xi$ are given; a digital controller 170; and an adder 143E:

$$x_d(k+1)=A_d x_d(k)+B_d h(k), \text{ and}$$

$$y(k)=C_d x_d(k)+q_y(k)$$

Here, $xd=[x\ \xi]^T$

The first equivalent disturbance $q_y$ is added to an output from the control target element 154 by the adder 143E, and the addition result is outputted as the control amount y.

The digital controller 170 is configured from a combination of transfer elements (from a feedback element 171 to an element 182) having respective parameters of $k_1, k_2, k_3, k_4, k_5, k_6, k_{1r}, k_{2r}, k_{3r}, k_i, k_{iz}$ and $k_{in}$; an element 144A and an element 144F each having an order 1/z (here, z=exp (j ω t)) corresponding to one sample delay; an element 183 of an order 1/z−1 serving as an integrator; an adder 143A; an adder 143B; an adder 184; and an adder 185.

Also, as shown in FIG. 2, the target value r is supplied to a feed forward element 177 for the parameter $k_{1r}$, a feed forward element 178 for the parameter $k_{2r}$, and a feed forward element 179 for the parameter $k_{3r}$. Also, the control amount y is supplied to the feedback element 171, the feedback element 172 and the feedback element 176 for the parameter $k_1$, the parameter $k_2$ and the parameter $k_6$.

A calculation delay output $\xi1$ inside the digital controller 170 is supplied to the feedback element 173 for the parameter $k_3$, and a difference between the target value r and a reference value y is supplied from the adder 184 to the element 183 of the order 1/z−1. Also, a delay output $\xi4$ from the element 183 of the order 1/z−1 is supplied to the element 182 for the parameter $k_{in}$.

An output from the element 182 for the parameter $k_{in}$ and outputs from the respective feedback elements 175, 176 for the parameters $k_5, k_6$ and an output from the feed forward element 179 for the parameter $k_{3r}$ are respectively added by the second adder 185.

An addition output from this second adder 185 is supplied to the first element 144F of the order 1/z, and the delay output $\xi3$ from the first element 144F of the order 1/z is supplied to the feedback element 175 for the parameter $k_5$ and the elements 180 and 181 for the parameters $k_i$ and $k_{iz}$, respectively.

An output from the element 180 for the parameter $k_i$, outputs from the respective feedback elements 171, 173 and 174 for the parameters $k_1, k_3$ and $k_4$, an output from the feed forward element 178 for the parameter $k_{2r}$, and a second equivalent disturbance $q_v$ are added by the third adder 143A.

An addition output v from the third adder 143A is supplied to the second element 144A of the order 1/z. Then, a delay output $\xi2$ from the second element 144A of the order 1/z, an output from the feedback element 172 for the parameter $k_2$, an output from the feed forward element 177 for the parameter $k_{1r}$, and an output from the element 181 for the parameter $k_{iz}$ are added by the fourth adder 143B. The delay output $\xi2$ from the second element 144A of the order 1/z as mentioned above is supplied to the feedback element 174 for the parameter $k_4$, and an addition output h from the fourth adder 143B is given to the control target element 154.

In other words, a control system of the power supply control apparatus configured from the digital controller shown in FIG. 2 includes a first feedback element for outputting a product of the control amount y and the parameter k1, a second feedback element for outputting a product of the control amount y and the parameter k2, a third feedback element for outputting a product of the first delay output $\xi1$ and the parameter k3, a fourth feedback element for outputting a product of the second delay output $\xi2$ and the parameter k4, a fifth feedback element for outputting a product of the third delay output $\xi3$ and the parameter k5, and a sixth feedback element for outputting a product of the control amount y and the parameter k6.

Also, the control system includes a first calculating element for calculating a difference between the control amount y and the target value r; an integrating element for integrating a calculation value from the first calculating element to convert into a fourth delay output $\xi4$; a first accumulating element for outputting a product of the fourth delay output $\xi4$ from the integrating element and a parameter kin; a first adding element for adding an output from the first accumulating element, an output from the fifth feedback element and an output from the sixth feedback element; a first delaying element for defining the addition result from the first adding element as the third delay output $\xi3$ that is sampling-delayed; a second accumulating element for outputting a product of the third delay output $\xi3$ and the parameter ki; and a third accumulating element for outputting a product of the third delay output $\xi3$ and the parameter kiz.

Then, the control system includes a second adding element for adding the second equivalent disturbance $q_v$, the output from the second accumulating element, the output from the first feedback element, the output from the third feedback element, and the output from the fourth feedback element; a second delaying element for defining the addition result from the second adding element as the second delay output ξ2 that is sampling-delayed; and a third adding element for adding the output of the second delaying element, the output of the third accumulating element and the output of the second feedback element to generate an input h to the control target.

Here, the adder 143A corresponds to the first adding element and the second adding element, the adder 143B corresponds to the second adding element and the third adding element, the element 144A corresponds to the second delaying element, and the element 144F corresponds to the first delaying element and the delaying element. Also, the control target element 154 corresponds to the control target, the feedback element 171 corresponds to the first feedback element, the feedback element 172 corresponds to the second feedback element, the feedback element 173 corresponds to the third feedback element, the feedback element 174 corresponds to the fourth feedback element, the feedback element 175 corresponds to the fifth feedback element, and the feedback element 176 corresponds to the sixth feedback element. Also, the feed forward element 177 corresponds to the first feedback element, the feedback element 178 corresponds to the second feed forward element, and the feed forward element 179 corresponds to the third feed forward element. Also, the element 80 corresponds to the second accumulating element, the element 82 corresponds to the first accumulating element, the element 83 corresponds to the integrating element, the first adder 84 corresponds to the first calculating element, the second adder 85 corresponds to the first adding element, and the first adder 87 corresponds to the first calculating element.

CITATION LIST

[Patent Literature 1] JP 2006-050723A

SUMMARY OF THE INVENTION

In order to satisfy the request for the performance improvement of the switching power supply control apparatus, it is necessary to achieve the power supply suitable for the operational state of the system. Thus, a necessity of miniaturizing the switching power supply control apparatus of a digital control type, which is used for a large-scale apparatus such as a server, and which is installed in the consumer appliances, is increased.

The technique described in the above Patent Literature 1 is a technique for a so-called robust PWM power amplifier in which one controller can cope with a wide load fluctuation and a voltage variation in a direct current power supply, and the control target is represented in a discrete time system, and DSP is used to configure a state feedback system, and a robust compensator that is obtained by approximating a feedback system is coupled to the control target. Consequently, the digital controller that is strong against output noise is achieved.

However, the technique described in the above Patent Literature 1 has a problem that a circuit area becomes large. The reason is as follows. That is, since a control system composed of the digital controllers has the first to sixth feedback elements each outputting a product of a constant, the first to third accumulating elements and the first to third feed forward elements. Thus, when the control system is configured in hardware, 12 accumulators are required, and the miniaturization in the circuit is made impossible.

A power supply control apparatus includes a first adder that generates a difference signal based on a target value and a feedback signal; a compensator that has a property of a first transfer function $Wc(z)$ and generates a control signal based on the difference signal; a control target that has a property of a second transfer function $Wp(z)$ and outputs an output signal generated in response to the control signal; a disturbance canceller that has a property of a third transfer function $\{1+Wc(z)\cdot Wp(z)\}/\{Wc(z)\cdot Wp(z)\}$ and generates a disturbance cancelling signal based on an output signal corresponding to a control amount y; a second adder that generates a differential disturbance signal based on an output signal of the first adder and a disturbance cancelling signal; and a filter circuit that has a property of a fourth transfer function $K(z)$ and generates a feedback signal based on the differential disturbance signal. Here, the compensator receives the difference signal and the output signal and carries out a compensating operation of the control amount y coincident with the target value, based on each of the difference signal and the output signal.

The switching power supply control apparatus of the digital control type includes the compensator having the property of the transfer function $Wc(z)$; the control target having the property of the transfer function $Wp(z)$; and the disturbance canceller having the property of the transfer function $\{1+Wc(z)\cdot Wp(z)\}/\{Wc(z)\cdot Wp(z)\}$. Thus, by this configuration, the power supply control apparatus difficult to receive influences of the conditions of a capacitance of a capacitor and an input voltage can be attained.

The circuit, which is obtained by approximating and equivalently converting the transfer functions of the compensator, the control target and the disturbance canceller, can be configured from the four accumulators of a proportion compensation gain Kp for carrying out a proportional compensation for the control target, an integration compensation gain Ki for carrying out an integration compensation for the control target, a feedback gain Kf for cancelling a disturbance transfer, and a filter circuit gain Kz. For this reason, there is an effect that the number of accumulators can be greatly reduced, thereby miniaturizing the circuit scale of the power supply control apparatus, as compared with the conventional techniques.

DESCRIPTION OF EMBODIMENTS

Hereinafter, embodiments of the present invention will be described in detail with reference to the drawings. It should be noted that same identifiers are assigned to same members, and repetitive description is omitted, in the following description of the embodiments.

Figure 3:
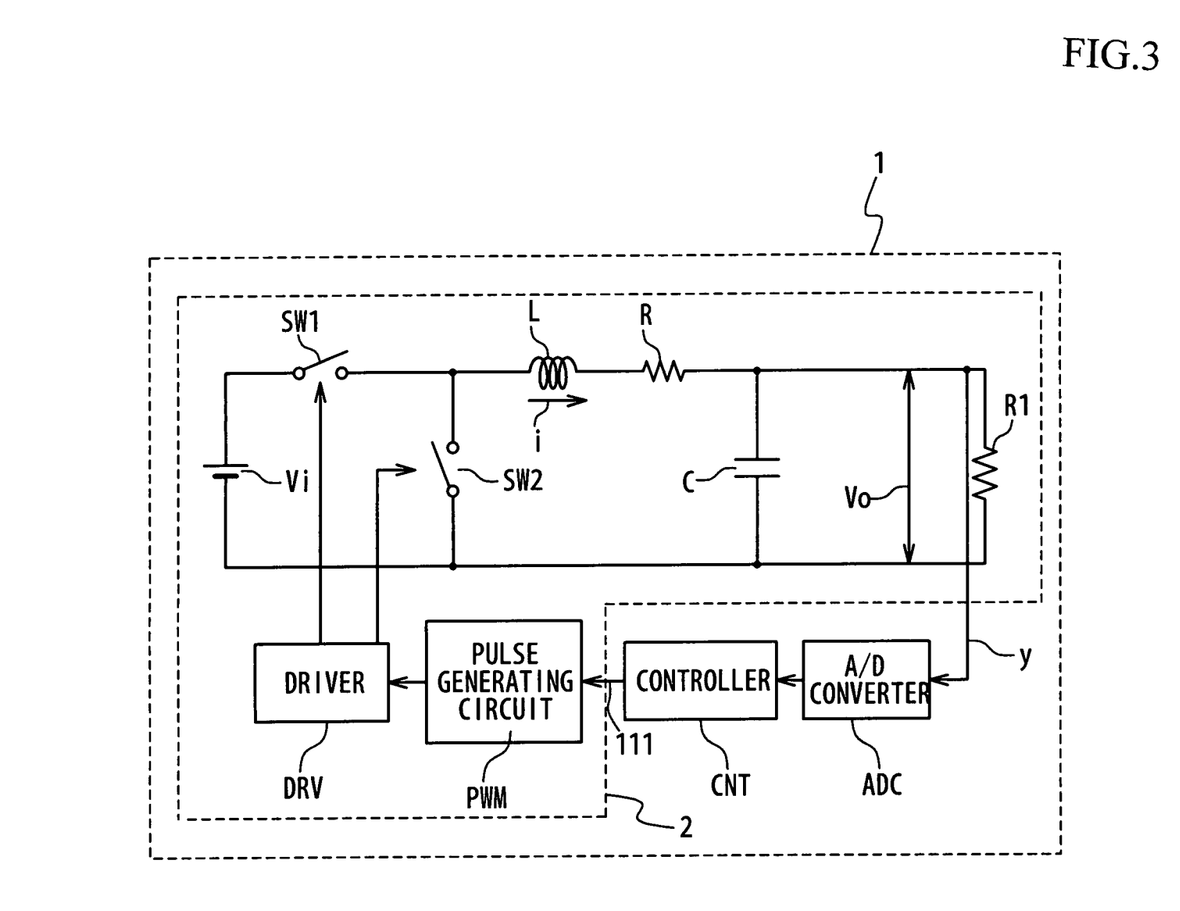
FIG. 3 is a circuit diagram showing a configuration of a power supply control apparatus according to an embodiment of the present invention.

FIG. 3 is a circuit diagram showing the configuration of a power supply control apparatus 1 in an embodiment. The power supply control apparatus 1 in present embodiment contains a step-down DC-DC converter 2, an A/D converter ADC and a controller CNT. The step-down DC-DC converter 2 contains a power supply Vi for supplying a voltage, a high-side switching element SW1, a low-side switching element SW2, an inductor L, a resistor R, a capacitor C, a load resistor R1, a pulse generating circuit PWM and a driver circuit DRV.

The power supply of the step-down DC-DC converter 2 is connected to the switching element SW1 at a high side. Also, the switching element SW2 is connected to a ground voltage as a low side of the power supply. The switching element SW1 and the switching element SW2 are connected through a connection node. An LC smoothing filter, which is composed of the inductor L, the resistor R as a direct current resistance component of the inductor L, and the capacitor C, is connected to the connection node. The load resistor R1 is connected in parallel to the capacitor C, and a voltage between both ends of the load resistor R1 is an output voltage Vo.

The A/D converter ADC receives the output voltage Vo as an input, AD-converts the output voltage Vo and outputs a digital code to the controller CNT. The controller CNT receives the digital code outputted from the A/D converter ADC. The controller CNT generates a control output in response to the received digital code, and supplies the control output to the pulse generating circuit PWM. The driver circuit DRV receives an output from the pulse generating circuit PWM and outputs a pulse signal to control an operation of each of the switching element SW1 and the switching element SW2.

Figure 4:
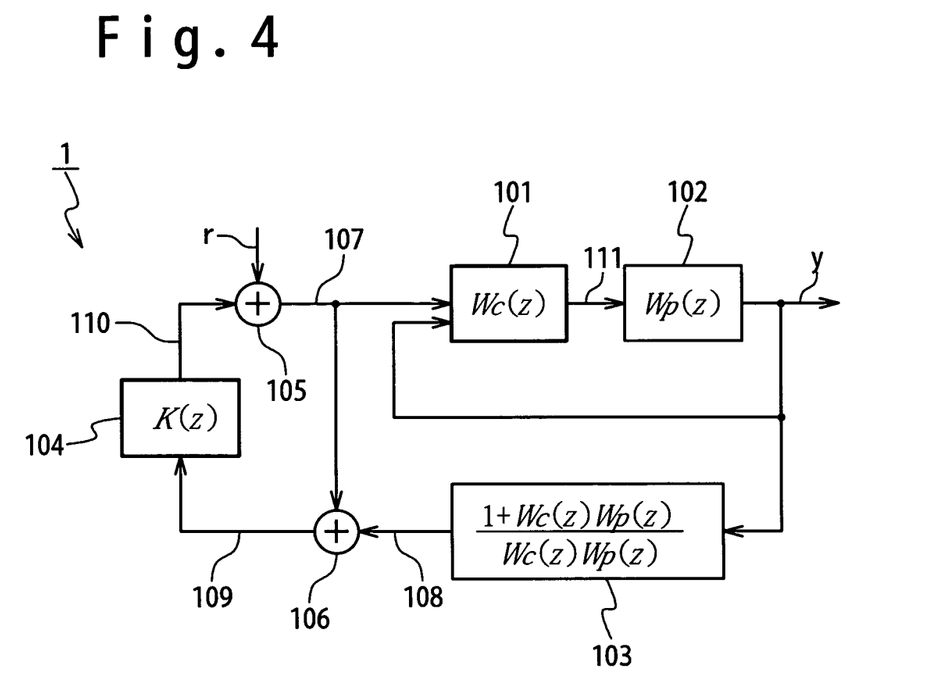
FIG. 4 is a block diagram showing when the power supply control apparatus 1 is represented by using transfer functions.

FIG. 4 is a block diagram when the power supply control apparatus 1 in the present embodiment is represented by using transfer functions. The power supply control apparatus 1 in the present embodiment contains a compensator 101, a control target 102, a disturbance canceller 103, a second adder 106, a filter circuit 104 and a first adder 105.

The compensator 101 receives a difference signal 107 and a control amount y and outputs a control signal 111. The compensator 101 has a transfer function Wc(z) represented by the following equation (1):

$$Wc(z) = K_p + \frac{K_i}{z-1} \quad (1)$$

The compensator 101 outputs the control signal 111 having Wc(z). The compensator 101 carries out a compensating operation, of a proportional compensation by using an item of an accumulation coefficient Kp and an integration compensation by using an item having an accumulation coefficient Ki, for the control target 102 such that the control amount y becomes equal to a target value r.

The control target 102 receives the control signal 111 and then outputs a control amount y. The control target 102 has a transfer function Wp(z) represented by the following equation (2):

$$Wp(z) = \frac{K_d(z-e_1)(z-e_2)}{(z+d_1)(z+d_2)(z+d_3)} \quad (2)$$

Here, in the equation (2), it is assumed that $K_d$ is a gain, $e_1$ and $e_2$ are zero points, and $d_1$, $d_2$ and $d_3$ are poles.

Here, when the difference signal 107 is received, and the control amount y is outputted by transferring through the compensator 101 and the control target 102, a synthetic transfer function Wcp(z) is represented by the following equation (3):

$$Wcp(z) = \frac{Wc(z)Wp(z)}{1+wC(z)Wp(z)} \quad (3)$$

The disturbance canceller 103 has an inverse transfer property of the equation (3) with regard to the control amount y. The transfer function $Wcp(z)^{-1}$ is represented by the following equation (4):

$$Wcp(z)^{-1} = \frac{1+Wc(z)Wp(z)}{Wc(z)Wp)(z)} \quad (4)$$

The disturbance canceller 103 receives the control amount y and outputs a disturbance cancelling signal 108.

The second adder 106 receives the difference signal 107 and the disturbance cancelling signal 108 and outputs a differential disturbance signal 109. The second adder 106 calculates a difference between the disturbance cancelling signal 108 and the difference signal 107 as a differential disturbance signal 109. Thus, the second adder 106 extracts the differential disturbance signal 109 which is a signal representing noise that is added to the control amount y and not transferred by the synthetic transfer function Wcp(z).

The filter circuit 104 has a transfer function K(z) represented by the following equation (5) and receives the differential disturbance signal 109 and outputs a feedback signal 110:

$$K(z) = \frac{K_z}{z-1+K_z} \quad (5)$$

The transfer function K(z) of the filter circuit 104 has a low pass property to the differential disturbance signal 109. Thus, the filter circuit 104 removes a lower frequency component of the differential disturbance signal 109, and outputs the remaining signal component as a feedback signal 110 to the first adder 105. It should be noted that an accumulation coefficient Kz determines a frequency property of the low pass filter.

The first adder 105 receives the target value r and the feedback signal 110, calculates a difference between the feedback signal 110 and the target value r, and outputs the difference signal 107 to the compensator 101 and the second adder 106.

Figure 5:
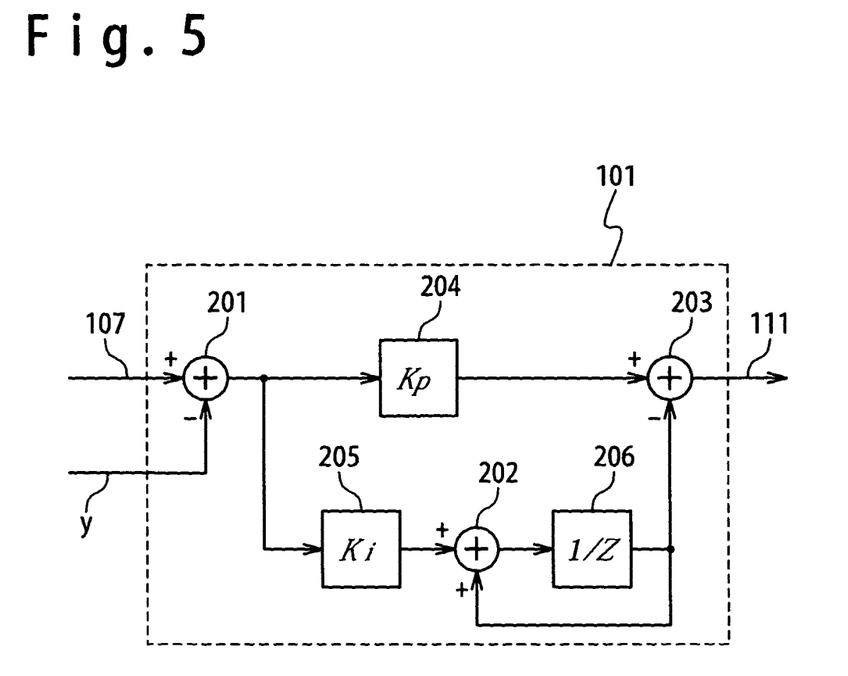
FIG. 5 is a block diagram showing a configuration of a compensator 101 in the embodiment.

FIG. 5 is a block diagram showing the configuration of the compensator 101 in the present embodiment. The compensator 101 contains a proportion compensation gain block 204, an integration compensation gain block 205, a third adder 201, a fourth adder 202, a fifth adder 203 and a delay block 206. The third adder 201 adds the difference signal 107 and the control amount y and outputs the addition result to the proportion compensation gain block 204 and the integration compensation gain block 205. The proportion compensation gain block 204 receives an output of the third adder 201, calculates a product of the accumulation coefficient Kp and the addition result of the third adder 201, and output the calculation result to the fifth adder 203. The integration compensation gain block 205 receives the output of the third adder 201, calculates a product of an accumulation coefficient Ki and the addition result of the third adder 201, and outputs the calculation result to the fourth adder 202.

The fourth adder 202 adds an output of the integration compensation gain block 205 and an output of the delay block 206 and outputs the addition result to the delay block 206. The delay block 206 delays the addition result of the fourth adder 202 by a unit time, and outputs the delayed addition result to the fourth adder 202 and the fifth adder 203. The fifth adder 203 adds an output of the proportion compensation gain block 204 and the output of the delay block 206 and outputs the addition result as the control signal 111.

Figure 6:
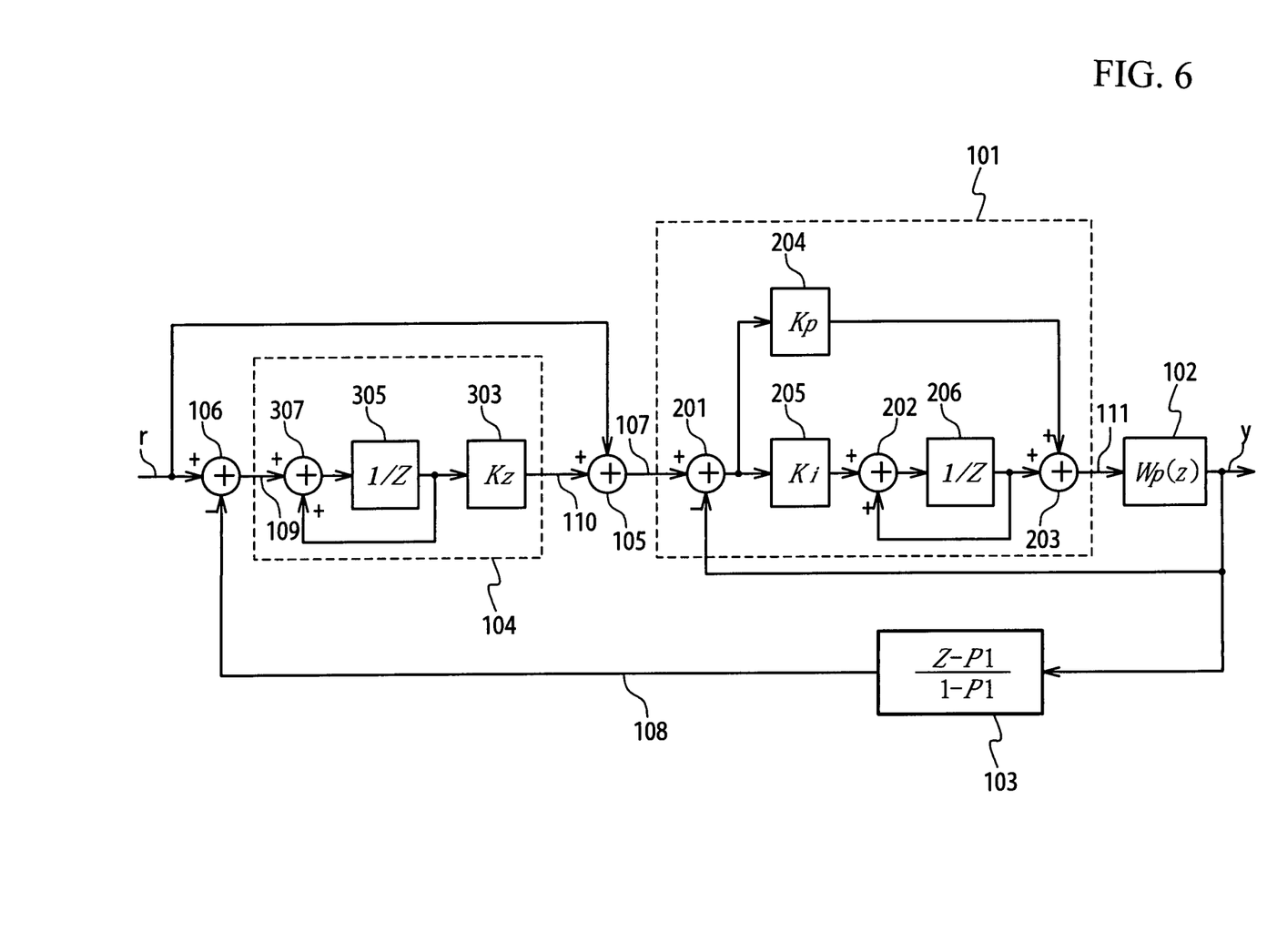
FIG. 6 is a block diagram showing a circuit when the power supply control apparatus 1 is equivalently converted.

FIG. 6 is a block diagram showing a circuit when the power supply control apparatus 1 shown in FIG. 4 is converted equivalently. In FIG. 6, in order to easily understand the present embodiment, the same reference symbols are allocated to the same configuration portions in FIG. 4 and FIG. 5. The power supply control apparatus 1 shown in FIG. 6 contains the compensator 101, the control target 102, the disturbance canceller 103 and the filter circuit 104, which are similar to the compensator 101 in FIG. 5. As mentioned above, the disturbance canceller 103 has the inverse transfer property of the synthetic transfer function Wcp(z) represented by the equation (3).

Here, the synthetic transfer function Wcp(z) represented by the above equation (3) is similar to a transfer function, represented by the following equation (6), which has one pole having a maximum absolute value in a pole P1, which determines the major portion of a transient response, among poles possessed by the synthetic transfer function Wcp(z), i.e., 0<|P1|<1, and has a gain of "1".

$$Wcp(z) \approx \frac{1 - P1}{z - P1} \quad (6)$$

Thus, the disturbance canceller 103 has a property represented by the following equation (7):

$$Wcp(z)^{-1} = \frac{z - P1}{1 - P1} \quad (7)$$

Also, the filter circuit 104 contains a filter circuit gain block 303, a delay block 305 and an adder 307. The adder 307 adds the addition result of the adder 106 and a feed back signal from the delay block 305 and output the addition result to the delay block 305. The delay block 305 delays the addition result of the adder 307 by a predetermined time and outputs the delay result to the filter circuit gain block 303 and the adder 307. The filter circuit gain block 303 receives an output from the delay block 305, calculates a product of the accumulation coefficient Kz and the output of the delay block 605, and outputs the calculation result 110 to the first adder 105.

Figure 7:
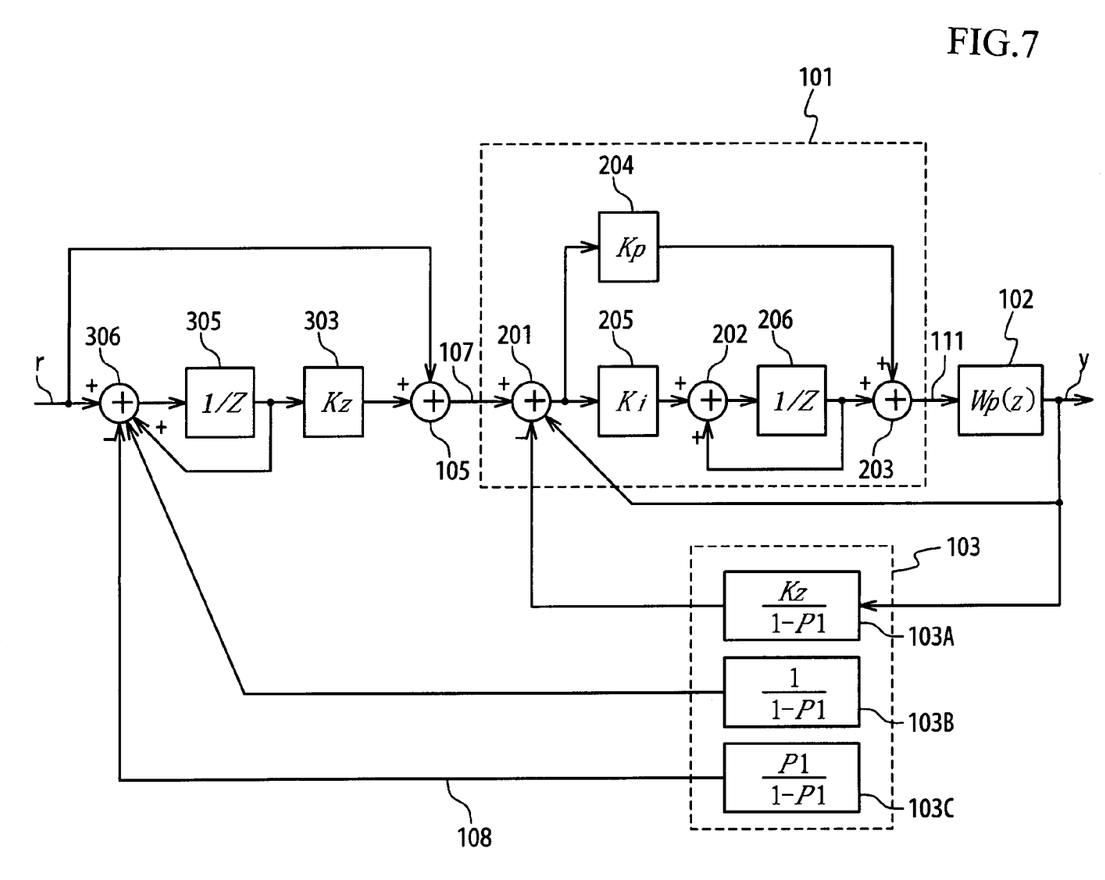
FIG. 7 is a block diagram showing a circuit when the power supply control apparatus 1 is equivalently converted.

FIG. 7 is a block diagram showing a circuit when the power supply control apparatus 1 shown in FIG. 6 is further converted equivalently. As shown in FIG. 7, the disturbance canceller 103 is divided into the transfer functions of an element 103A, an element 103B and an element 103C. Also, in the power supply control apparatus 1 that is equivalently converted, a seventh adder 306 is configured in which the second adder 106 and an adder 307 are combined.

Figure 8:
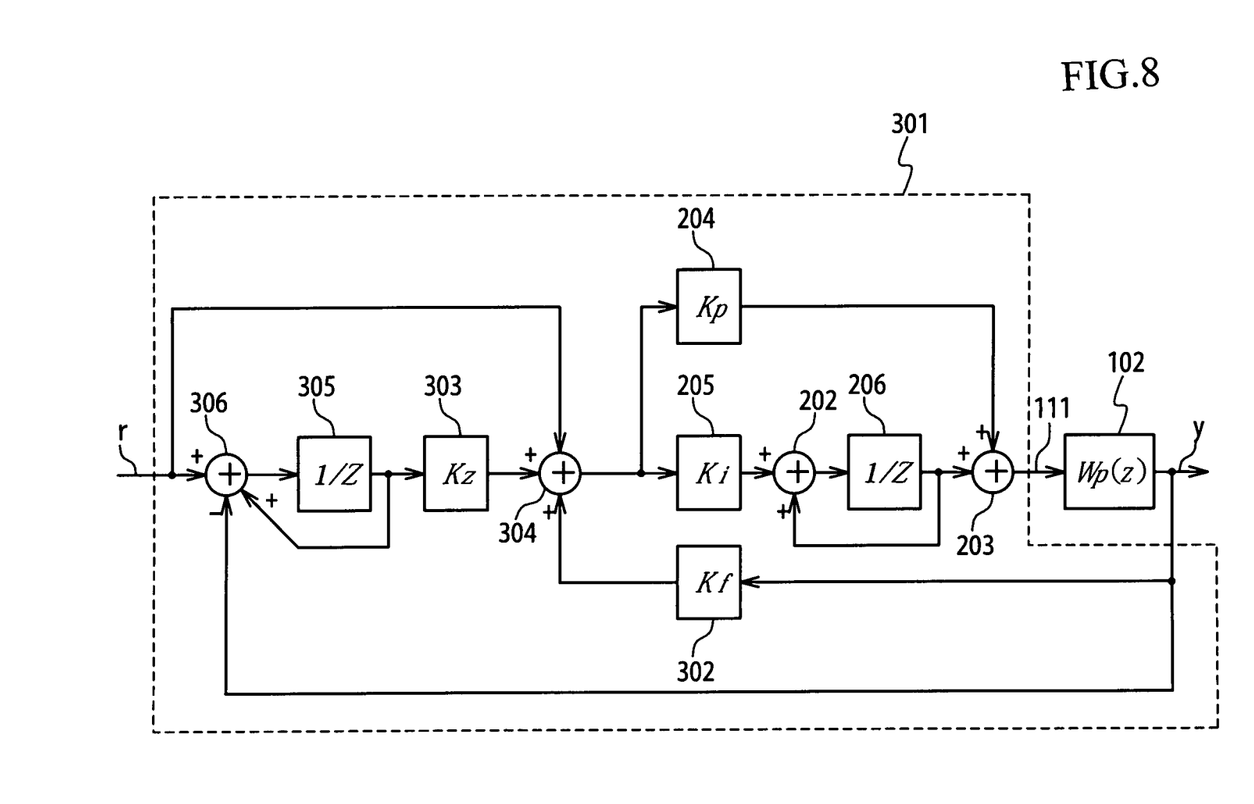
FIG. 8 is a block diagram showing a circuit when the power supply control apparatus 1 is further equivalently converted.

FIG. 8 is a block diagram showing the circuit when the power supply control apparatus 1 shown in FIG. 7 is further equivalently converted. The power supply control apparatus 1 is composed of the control target 102 and a controller function block 301. In the controller function block 301, a feedback gain block 302 is configured by combining the control amount y and the property of the element 103A. Also, the gain of 1 is obtained through a combination of the element 103B and the element 103C, and as a result of this, a feedback having no multiplication coefficient is generated. Moreover, a third adder 304 is configured through a combination of the first adder 105 and the third adder 201.

Also, the controller function block 301 contains the fourth adder 202, the fifth adder 203, the proportion compensation gain block 204, the integration compensation gain block 205 and the delay block 206, the filter circuit gain block 303, a sixth adder 304, the delay block 305 and a seventh adder 306.

The seventh adder 306 adds the target value r, the control amount y and the output of the delay block 305 and outputs the addition result to the delay block 305. The delay block 305 receives an output from the seventh adder 306, delays the received output by a unit time and outputs to the filter circuit gain block 303 and the seventh adder 306. The filter circuit gain block 303 receives the output from the delay block 305, calculates a product of the received output and the accumulation coefficient Kz and outputs the calculation result to the sixth adder 304. The sixth adder 304 adds the target value r, an output of the feedback gain block 302 and the output of the filter circuit gain block 303, and outputs the addition result to the proportion compensation gain block 204 and the integration compensation gain block 205.

As mentioned above, when the transfer function of the disturbance canceller 103 is defined as the inverse transfer function of the equation (6), the configuration of the controller function block 301 is obtained through the equivalent conversion of the power supply control apparatus 1 shown in FIG. 4, as shown in a block diagram of FIG. 8. In the controller function block 301 shown in FIG. 8, a feedback gain Kf of the feedback gain block 302 is represented by the following equation (8):

$$Kf = \frac{K_z}{1-P1} - 1 \quad (8)$$

The controller function block 301 corresponds to the controller CNT of the power supply control apparatus 1 shown in FIG. 4. As shown in FIG. 8, in the power supply control apparatus 1 of the present embodiment, the controller CNT can be configured from the four accumulators (the proportion compensation gain block 204, the integration compensation gain block 205, the feedback gain block 302 and the filter circuit gain block 303), the four adders (the fourth adder 202, the fifth adder 203, the sixth adder 304 and the seventh adder 306) and the two delay blocks (the delay block 206 and the delay block 305).

Also, in the power supply control apparatus 1 of the present embodiment, it is possible to attain the response property that is sufficiently stable, while the circuit scale of the power supply control apparatus is made small. An operation of the power supply control apparatus 1 of the present embodiment will be described below with reference to the specific circuit. With reference to FIG. 3 as mentioned above, the voltage Vi is converted into the output voltage Vo, which is a direct current voltage, through the inductance component and the capacitance components of the LC smoothing filter by the on/off control of the switching element SW1 and the switching element SW2.

The output voltage Vo is converted into a digital output voltage signal through the A/D converter ADC. The controller CNT carries out a control operation for sending a stable output so that the output voltage Vo is not vibrated. The output of the controller CNT is converted into a pulse signal by the pulse generating circuit PWM and converted into an on/off time ratio to drive the switching element SW1 and the switching element SW2 through the driver circuit DRV.

The controller CNT of the power supply control apparatus 1 is equivalent to the controller function block 301 shown in FIG. 8. Also, a step-down DC-DC converter 2 corresponds to the control target 102. With regard to the step-down DC-DC converter 2, a state equation is represented by the following equation (9):

$$\begin{cases} x = Ax + Bu \\ y = Cx \end{cases} \quad (9)$$

Here, $$A = \begin{bmatrix} -\frac{1}{CR1} & \frac{1}{C} \\ -\frac{1}{L} & -\frac{R}{L} \end{bmatrix}$$

$$B = \begin{bmatrix} 0 \\ \frac{V_i}{L} \end{bmatrix}$$

$$C = [1 \quad 0]$$

$$x = \begin{bmatrix} V_o \\ i \end{bmatrix}$$

A discretization state equation in which the equation (9) is discretized in a switching period T is represented by the following equation (10):

$$\begin{cases} x_d(K+1) = A_d x_d(K) + B_d v(K) \\ y(K) = C_d x_d(K) \end{cases} \quad (10)$$

Here, $$A_d = \begin{bmatrix} e^{Act} & \int_0^T e^{A(T-\tau)} B_c dt \\ 0 & 0 \end{bmatrix}$$

$$B_d = \begin{bmatrix} 0 \\ 1 \end{bmatrix}$$

$$C_d = [C \quad 0]$$

$$x_d(K) = \begin{bmatrix} x(K) \\ u(K) \end{bmatrix}$$

The transfer function of the equation (10) is represented by the following equation (11), and the transfer function Wp(z) of the control target 102 is determined. In the equation (11), I represents a unit matrix, adj represents a cofactor matrix, and det represents a determinant.

$$Wp(z) = \frac{C_d adj(zI - A_d) B_d}{\det(zI - A_d)} \quad (11)$$

The effect of the power supply control apparatus 1 of the present embodiment will be described below. The respective elements that configure the step-down DC-DC converter 2 shown in FIG. 3 are assumed to meet the following conditions:

Vi=3.3 V

C=10 µF

L=2.2 µH

R=0.72Ω

At this time, when these conditions are substituted into the equation (11), the transfer function of the step-down DC-DC converter 2 corresponding to the control target 102 is represented by the equation (12):

$$Wp(z) = \frac{2.977 \times 10^{-9}(z+9.4542 \times 10^5)(z+0.9399)}{(z-0)(z-(0.91434+0.677i))(z-(0.91434-0.0677i))} \quad (12)$$

On the other hand, when the conditions of the compensator 101 are assumed to be Kp=1.9 and Ki=0.05, the transfer function of the compensator 101 is represented by the equation (13):

$$Wc(z) = 1.9 + \frac{0.05}{z-1} \quad (13)$$

Thus, the synthetic transfer function for the control target and the compensator is represented by the equation (14):

$$Wcp(z) = \frac{7.5564 \times 10^{-9}(z + 9.4542 \times 10^5)(z + 0.9399)(z - 0.97368)}{(z - 0.98433)} \quad (14)$$
$$(z - (0.92597 + 0.1327i))$$
$$(z - (0.92597 - 0.1327i))$$
$$(z - 0.0075913)$$

The pole having the maximum absolute value is defined as P1=0.98433 among poles of the synthetic transfer function of the equation (14), and it is substituted into the equation (8). As a result, the feedback gain Kf of the controller function block 301 has a value indicated by the following equation (15):

$$Kf = \frac{Kz}{1 - 0.98443} - 1 \quad (15)$$

By shifting Kz in a range of 0<Kz and checking the response of the output voltage Vo so that Kz=0.22 is set at which the output voltage Vo is stable without any oscillation, it is possible to attain the power supply control apparatus having the stable response property.

Figure 9A:
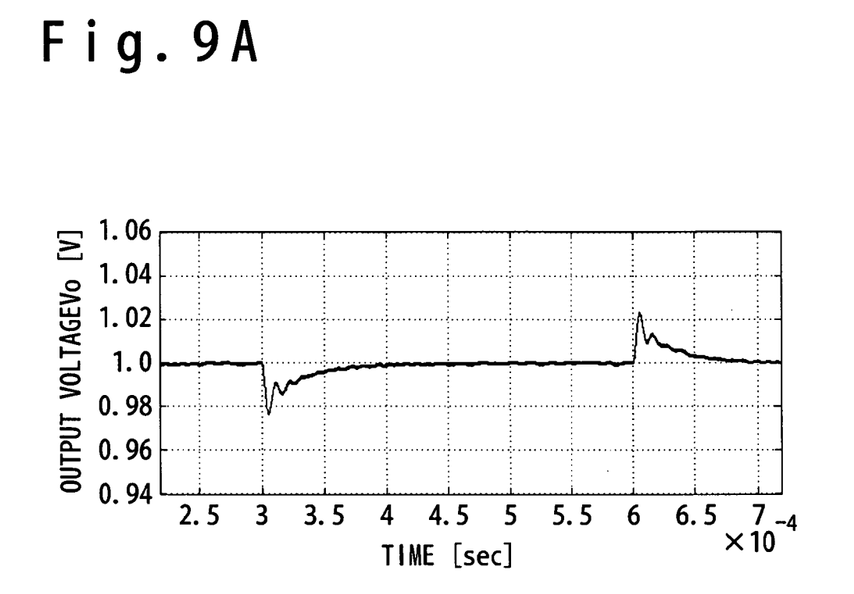
FIG. 9A is a graph showing a dynamic load response when a load of the power supply control apparatus 1 in the embodiment is sharply changed.
Figure 9B:
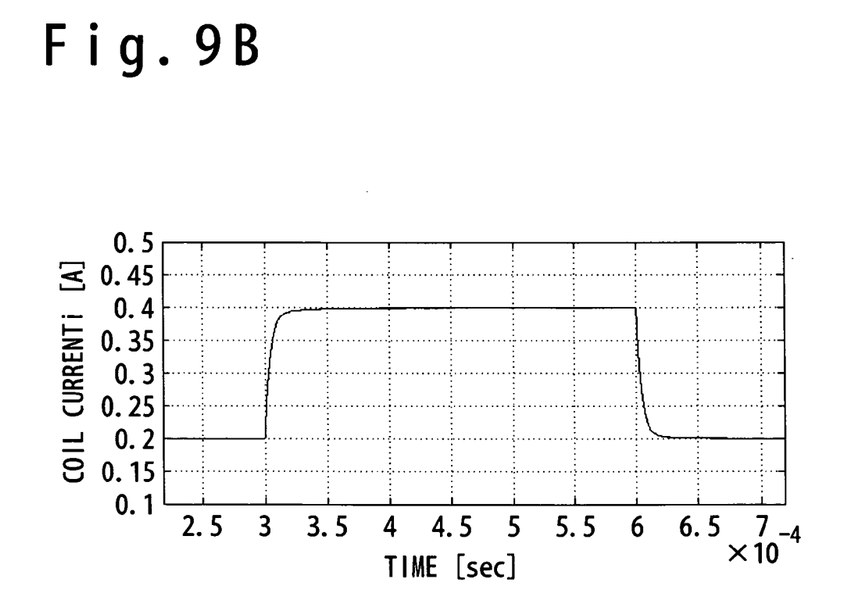
FIG. 9B is a graph showing a dynamic load response when a load of the power supply control apparatus 1 in the embodiment is sharply changed.

FIG. 9A and FIG. 9B are graphs showing the dynamic load response when the load of the power supply control apparatus 1 of the present embodiment is sharply changed. FIG. 9A is a waveform showing the change of an output voltage with respect to a temporal elapse. FIG. 9B is a waveform showing the change of a load current with respect to the temporal elapse. As shown in FIG. 9A and FIG. 9B, the load current (coil current i) is sharply changed from 200 mA to 400 mA. At this time, the fluctuation of the output voltage Vo is suppressed to 25 mV or less. Thus, it is possible to attain the sufficiently stable response property.

Figure 10A:
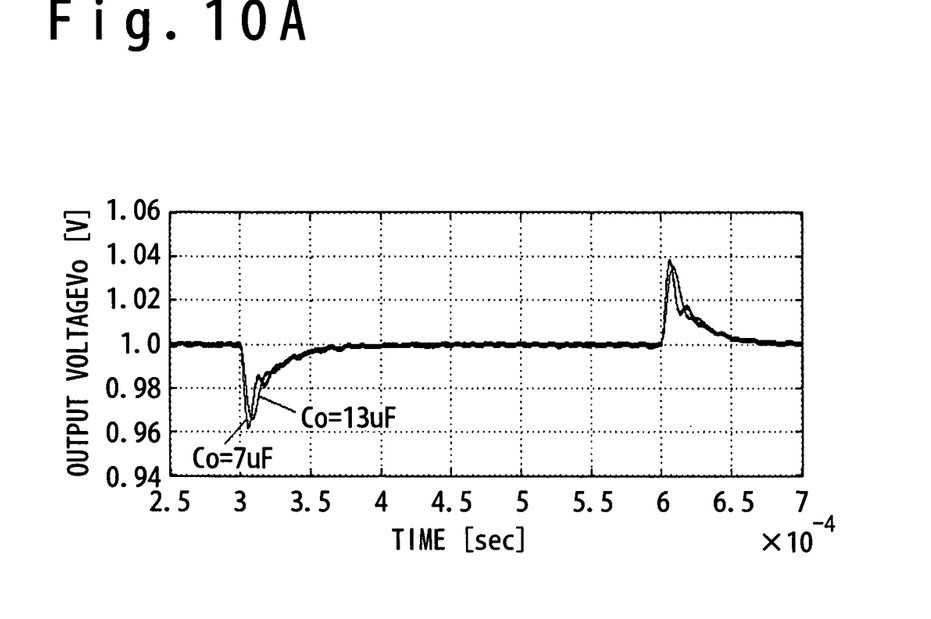
FIG. 10A is a graph showing a dynamic load response when a capacitance of a capacitor in the power supply control apparatus 1 in the embodiment is sharply changed.
Figure 10B:
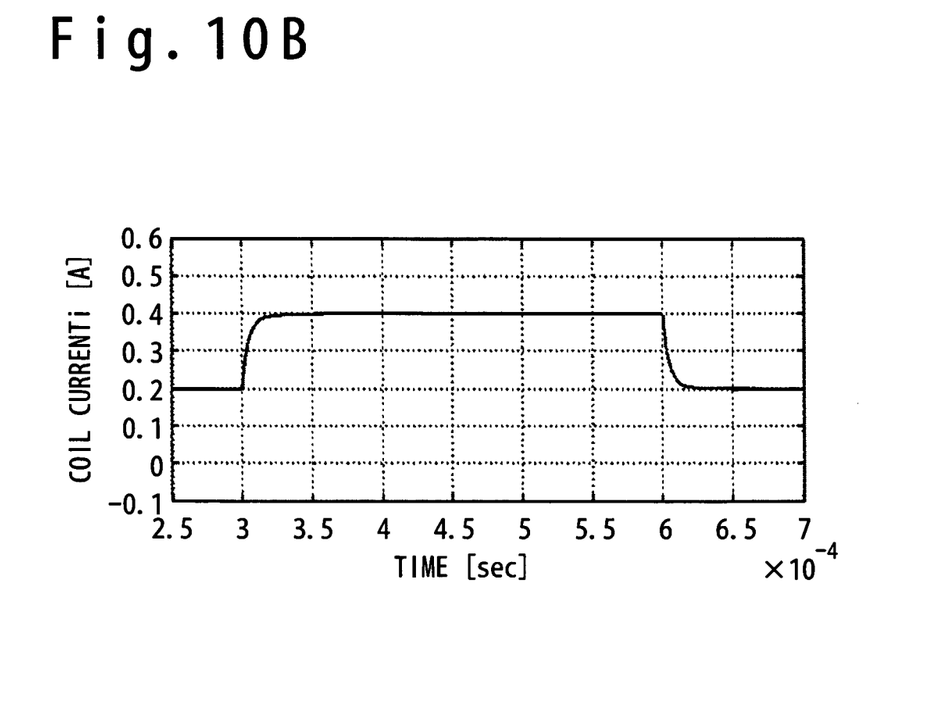
FIG. 10B is a graph showing a dynamic load response when the capacitance of the power supply control apparatus 1 in the embodiment is sharply changed.

FIG. 10A and FIG. 10B are graphs showing the dynamic load response when the capacitance of the power supply control apparatus 1 of the present embodiment is sharply changed. FIG. 10A is a waveform showing the changes of the output voltage with respect to the temporal elapse when the capacitance of a capacitor Co is set to 7 μF and 13 μF. FIG. 10B is a waveform showing the change of the load current with respect to the temporal elapse when the load current (coil current i) is sharply changed from 200 mA to 400 mA. The responses when the load current (coil current i) is sharply changed from 200 mA to 400 mA are compared in cases that the capacitance of the capacitor Co is set to 7 μF and 13 μF. In this case, the sufficiently stable response property can be attained without any generation of the great difference in the fluctuation of the output voltage Vo.

Figure 11:
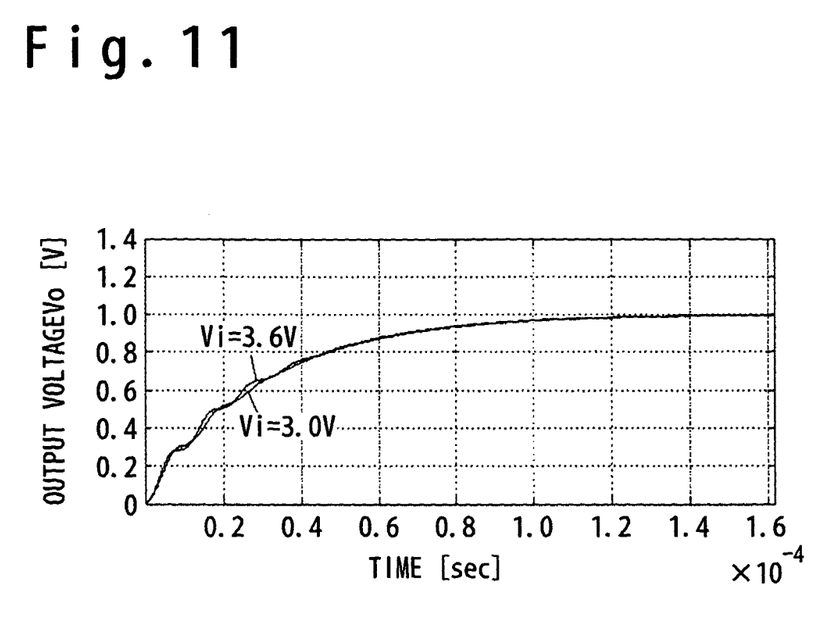
FIG. 11 is a graph showing a response property of an output voltage at a time of a startup when an input voltage of the power supply control apparatus 1 in the embodiment is changed.

FIG. 11 is a graph showing the response property of the output voltage at the time of the startup at which the input voltage of the power supply control apparatus 1 of the present embodiment is changed. FIG. 11 shows the waveforms that indicate the response properties at the time of the startup when the input voltage Vi is set to 3.0 V and is set to 3.6 V. As shown in FIG. 11, even when the input voltage Vi is set to 3.0 V and 3.6 V, the power supply control apparatus 1 of the present embodiment can provide the sufficiently stable response property without any generation of the great difference at a startup time and a transient response.

As shown in FIG. 10A, FIG. 10B and FIG. 11, the power supply control apparatus 1 of the present embodiment is configured as the power supply control apparatus having the so-called robust property, which does not depend on the conditions of the capacitance of the capacitor Co and the input voltage Vi. Also, in the power supply control apparatus 1, the controller CNT of the power supply control apparatus 1 can be configured from the four integrators of the proportion compensation gain block 204, the integration compensation gain block 205, the feedback gain block 302 and the filter circuit gain block 303; the four adders of the fourth adder 202, the fifth adder 203, the sixth adder 304 and the seventh adder 306; and the two delay blocks of the delay block 206 and the delay block 305. For this reason, the eight integrators can be decreased as compared with the conventional technique. Consequently, it is possible to configure the power supply control apparatus, which is small in the circuit scale and has the sufficiently stable response property.

As mentioned above, the embodiments of the present invention have been specifically described. The present invention is not limited to the above-mentioned embodiments and various modifications are possible in a range without departing from the scope and spirit.

What is claimed is:

1. A power supply control apparatus comprising:
a first adder configured to generate a difference signal based on a target value and a feedback signal;
a compensator having a first transfer function Wc(z) and configured to generate a control signal based on the difference signal;
a control target having a second transfer function Wp(z) and configured to output an output signal generated in response to said control signal;
a disturbance canceller having a third transfer function $\{1+Wc(z) \cdot Wp(z)\}/\{Wc(z) \cdot Wp(z)\}$ and configured to generate a disturbance cancelling signal based on the output signal corresponding to a control amount y;
a second adder configured to generate a differential disturbance signal based on an output of said first adder and the disturbance cancelling signal; and
a filter circuit having a fourth transfer function K(z) and configured to generate the feedback signal based on the differential disturbance signal,
wherein said compensator receives the difference signal and the output signal and carries out a compensating operation based on the difference signal and the output signal such that the control amount y becomes equal to the target value.

2. The power supply control apparatus according to claim 1, wherein the first transfer function is represented by the following equation:

$$Wc(z) = K_p + \frac{K_i}{z - 1}$$

and a proportional compensation is executed by use of an item of an accumulation coefficient Kp, and an integration compensation is executed by use of an item of an integration coefficient Ki, and
the second transfer function Wp(z) is represented by the following equation:

$$Wp(z) = \frac{K_d(z - e_1)(z - e_2)}{(z + d_1)(z + d_2)(z + d_3)}$$

when $K_d$ indicates a gain, $e_1$ and $e_2$ indicate zero points, and $d_1$, $d_2$ and $d_3$ indicate poles.

3. The power supply control apparatus according to claim 2, wherein said compensator and said control target are represented by a synthetic transfer function Wcp(z), and said synthetic transfer function Wcp(z) is represented by the following equation:

$$Wcp(z) = \frac{Wc(z)Wp(z)}{1 + Wc(z)Wp(z)}$$

and said disturbance canceller has an inverse transfer property of said synthetic transfer function Wcp(z) for the control amount y.

4. The power supply control apparatus according to claim 3, wherein said disturbance canceller has a pole, which determines a main portion of a transient response, among poles possessed by the synthetic transfer function, and has a gain of 1.

5. The power supply control apparatus according to claim 4, wherein said filter circuit has a transfer function represented by the following equation that includes an item having an accumulation coefficient Kz, and $$K(z) = \frac{K_z}{z - 1 + K_z}$$

a circuit obtained by equivalently converting said first transfer function, said third transfer function and said fourth transfer function respectively corresponding to said filter circuit, said compensator and said disturbance canceller, comprises:

a proportion compensation gain block in which a proportional compensation for said control target is carried out based on the accumulation coefficient Kp;

an integration compensation gain block in which an integration compensation for said control target is carried out based on the accumulation coefficient Ki;

a feedback gain block which cancels transfer of disturbance; and a filter circuit gain block which has a property represented by an equation that includes an item having the accumulation coefficient Kz, and wherein said feedback gain block has a property represented by the following equation, when a pole, which determines a main portion of transient property, among poles of said synthetic transfer function, is defined as P1:

$$Kf = \frac{K_z}{1 - P1} - 1.$$

* * * * *